US007766664B2

(12) United States Patent
Cheng et al.

(10) Patent No.: US 7,766,664 B2

(45) Date of Patent: Aug. 3, 2010

(54) POWER CONNECTOR AND POWER CONNECTOR ASSEMBLY WITH CONTACT PROTECTION MECHANISM

(75) Inventors: I-Hung Cheng, Jhonghe (TW); Kuo-Cheng Liu, Jhonghe (TW)

(73) Assignee: Alltop Electronics (Su Zhou) Co., Ltd, Taicang (CN)

( * ) Notice: Subject to any disclaimer, the term of this patent is extended or adjusted under 35 U.S.C. 154(b) by 0 days.

(21) Appl. No.: 12/350,757

(22) Filed: Jan. 8, 2009

(65) Prior Publication Data

US 2010/0081338 A1 Apr. 1, 2010

(30) Foreign Application Priority Data

Sep. 29, 2008 (CN) .................... 2008 2 0139140 U

(51) Int. Cl.
*H01R 12/00* (2006.01)
*H05K 1/00* (2006.01)

(52) U.S. Cl. ......................................... 439/65; 439/825

(58) Field of Classification Search ................... 439/65, 439/79, 825, 855, 856

See application file for complete search history.

(56) References Cited

U.S. PATENT DOCUMENTS

| | | | | |
|---|---|---|---|---|
| 6,319,075 | B1 * | 11/2001 | Clark et al. | 439/825 |
| 6,402,566 | B1 * | 6/2002 | Middlehurst et al. | 439/699.1 |
| 6,805,591 | B2 * | 10/2004 | Garland et al. | 439/733.1 |
| 7,104,812 | B1 * | 9/2006 | Bogiel et al. | 439/79 |
| 7,303,401 | B2 * | 12/2007 | Schell et al. | 439/65 |
| 7,452,249 | B2 * | 11/2008 | Daily et al. | 439/825 |

* cited by examiner

*Primary Examiner*—Hae Moon Hyeon

(74) *Attorney, Agent, or Firm*—Sughrue Mion, PLLC

(57) ABSTRACT

The present invention relates to a power connector. The power connector includes a housing and a number of contacts received in the housing. At least one of the contacts includes a pair of opposite walls spaced apart at a predetermined distance. The walls have a front end respectively. The contact may further include a contact protection mechanism for protecting the contacts, wherein the contact protection mechanism bridges the front ends of the walls. The present invention also relates to a power connector assembly.

19 Claims, 4 Drawing Sheets

POWER CONNECTOR AND POWER CONNECTOR ASSEMBLY WITH CONTACT PROTECTION MECHANISM

BACKGROUND OF THE INVENTION

1. Field of the Invention

The present invention relates to a power connector and a power connector assembly, and more particularly, to a power connector and a power connector assembly with contact protection mechanism adapted to transmit power between circuit boards or backplane connection systems.

2. Description of Related Arts

Power connectors are known from the prior art. For instance, U.S. Pat. No. 6,319,075 discloses a power connector assembly for transmitting electricity between two circuit boards or backplane connection systems. The power connector assembly includes a plug connector and a receptacle connector which comprises an insulation housing and a plurality of power contacts received therein, respectively. Each of the power contacts comprises a terminal portion to be attached to a corresponding circuit board so as to establish mechanical and electrical connections to the circuit board. The receptacle power contacts each comprises a pair of walls spaced apart from each other and disposed in parallel, and an insertion opening is formed at the front ends of the walls to allow insertion of a corresponding plug power contact. The insertion opening extends along the whole width of the walls and thereby it has a length which is substantially equal to the width of the walls. The plug power contacts each comprises a pair of cantilever beams, wherein the distal sections thereof can be positioned slightly apart when the beams are in a relaxed position, but come together when the beams are deflected by an inner surface of the walls of the receptacle contacts as the cantilever beams are inserted into corresponding receptacle power contacts and received in a mating space thereof.

As the insertion opening of the receptacle contact is so narrow that it is not easy to insert the plug contacts into corresponding receptacle contacts. Moreover, harmful deformation of the cantilever beams may occur because of improper distribution of pressure during mating of the plug and receptacle contacts. Further, the environmental situations of the power connectors can be very bad, and foreign particles may enter into the contacts for instance into the mating space of the receptacle contacts, which might result in deformation or failure of the contacts.

SUMMARY OF THE INVENTION

Accordingly, an object of the present invention is to provide a power connector which can reduce the possibility of entering of foreign particles into a contact of the power connector, and the reliability and life time of the power connector can accordingly be increased.

Another object of the present invention is to provide a power connector assembly with such a power connector.

An aspect of the present invention relates to a power connector. The power connector comprises a housing, and a plurality of contacts received in the housing, at least one of the contacts comprising: a pair of opposite walls spaced apart at predetermined distance, the walls having a front end respectively, and a contact protection mechanism for protecting the contacts, wherein the contact protection mechanism bridges the front ends of the walls.

According to an embodiment of the present invention, the contact protection mechanism is an integral part of at least one of the pair of the walls.

According to an embodiment of the present invention, the contact protection mechanism is an integral part of the pair of the walls.

According to an embodiment of the present invention, the contact protection mechanism comprises a connecting bridge connecting the front ends of the walls, and the connecting bridge protrudes beyond the front ends.

According to an embodiment of the present invention, the contact is a receptacle contact, and the contact comprises an insertion opening formed between the front ends of the walls and an engaging space disposed between the pair of walls for receiving a plug contact, wherein the engaging space is in fluid communication with the insertion opening.

According to an embodiment of the present invention, the contact protection mechanism extends along at least one edge of the insertion opening.

According to an embodiment of the present invention, the contact is a plug contact, and each of the walls comprises a side edge extending in a frontward and rearward direction, wherein the contact protection mechanism is distanced from at least one of the side edges.

According to an embodiment of the present invention, the front end has a middle portion, and the contact protection mechanism is formed on the middle portion.

According to an embodiment of the present invention, the contact protection mechanism has a width which is at least a half of a width of the front ends of the walls.

According to an embodiment of the present invention, wherein the pair of walls each comprises an opening, and a cantilever beam to contact with a receptacle contact extends outwardly from an edge of the opening.

Another aspect of the present invention relates to a power connector assembly. The power connector assembly comprises: a plug connector, comprising a first housing and a plurality of plug contacts received in the first housing, the plug contacts comprising a pair of first walls spaced apart from each other, respectively; a receptacle connector for mating with the plug connector, the receptacle connector comprising a second housing and a plurality of receptacle contacts received in the second housing, the receptacle contacts comprising a pair of second walls spaced from each other and an insertion opening disposed between front ends of the walls for insertion of the corresponding plug contacts, respectively; wherein the pair of first walls are bridged at the front ends thereof to formed a first connecting bridge, and/or the second walls are bridged at the front ends thereof to formed a second connecting bridge.

According to an embodiment of the present invention, each of the second connecting bridges extends along at an edge of the insertion opening.

According to an embodiment of the present invention, each of the second connecting bridges protrudes beyond the front ends of the second walls.

According to an embodiment of the present invention, wherein the front ends of each pair of the second walls are bridged by the connecting bridges at opposite ends.

According to an embodiment of the present invention, wherein each of the first walls comprises a side edge extending along an insertion direction along which a corresponding plug contact is inserted, and the first connecting bridge is distanced from the side edge in a direction perpendicular to the insertion direction.

According to an embodiment of the present invention, the front end of each of the first walls comprise a middle portion, and the first connecting bridge is disposed at the middle portion According to an embodiment of the present invention, at least one of the first connecting bridges has a width which is at least a half of that of the first wall.

According to an embodiment of the present invention, the power connector according to claim 15, wherein each of the first walls has an opening and a cantilever beam for contacting with a corresponding receptacle contact, the cantilever beams extending outwardly from an edge of the opening.

According to an embodiment of the present invention, at least one of the first connecting bridges is integrated with a corresponding pair of the first walls, and at least one of the second connecting bridges is integrated with a corresponding pair of second walls.

A still another aspect relates to a contact for a power connector. The contact comprising a pair of opposite walls spaced apart at a predetermined distance, the walls having a front end respectively, and at least one connecting bridge connecting the front ends of the walls.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE INVENTION

The present invention will now be described more fully with reference to the accompanying drawings, in which exemplary embodiments of the invention are shown.

Figure 1:
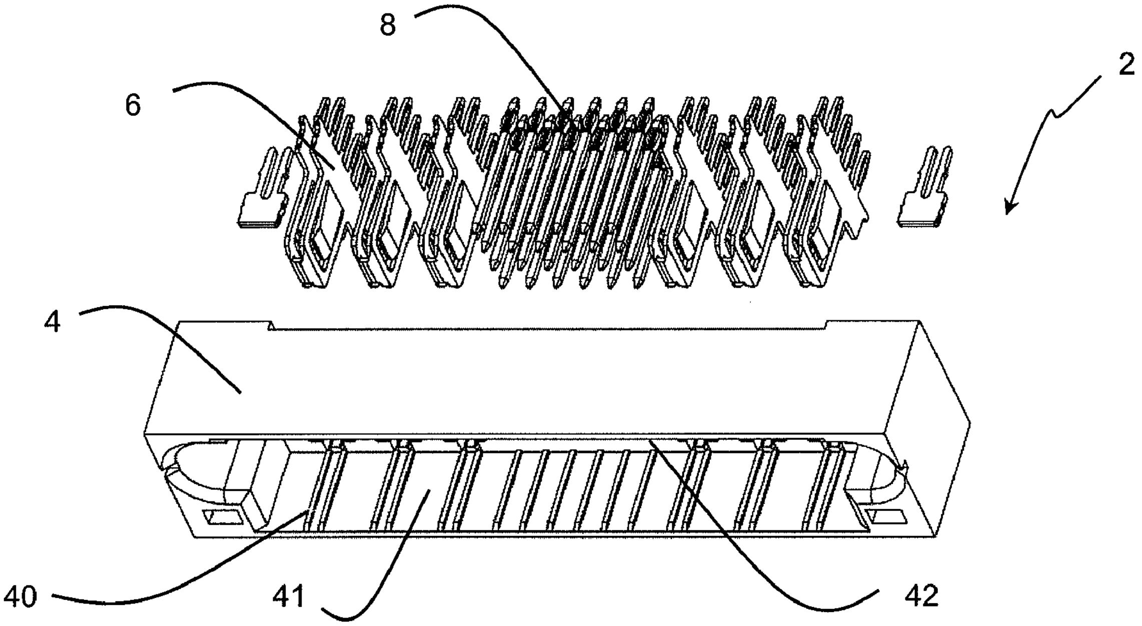
FIG. 1 is an exploded perspective view of a plug connector according to an embodiment of the present invention.

Referring to FIG. 1, the plug connector 2 comprises a plug housing 4, a plurality of plug contacts 6 for transmitting power and a plurality of plug signal contacts 8.

In this embodiment, the plug housing 4 has a shape of cube. The plug housing 4 has a plurality of passages 40 to receive and retain the corresponding contacts 6, 8. The plug housing 4 has a slot 41 therein. The contact portions (to be described with more details below) are disposed in the slot 41. The front surface 42 of the plug connector 2 forms a mating surface. When mating with a receptacle connector 1, the front surface 42 is in contact with a corresponding mating surface of a receptacle housing 3 of the receptacle connector 1.

Figure 2:
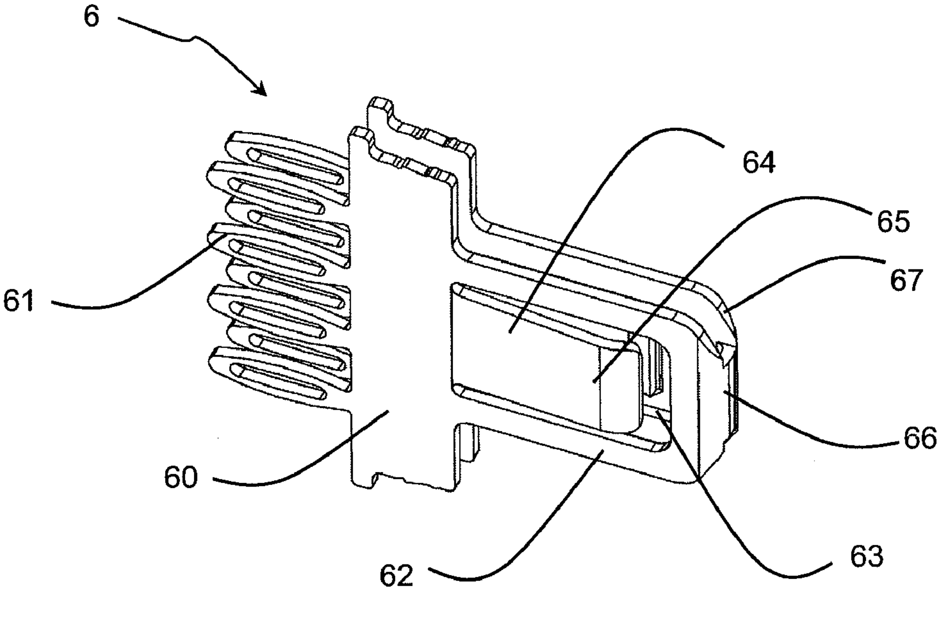
FIG. 2 is a perspective view of a plug contact according to an embodiment of the present invention.

Each of the plug contacts 6 has the same structure; therefore only one of them will be described in details. Referring to FIGS. 1 and 2, the plug contact 6 comprises a pair of opposite major side walls 60 spaced apart from each other, a plurality of terminal portions 61 extending from an end of a corresponding major side wall 60, and a pair of first walls 62 extending from an opposite end of the major side walls 60, respectively.

The major side wall 60 has a shape of plate, and is received and retained in the passage 40 of the plug housing 4. In this embodiment, four terminals portions 61 extend rearwardly from each of the major side walls 60. The terminal portion 61 is configured to be suitable to be connected to a printed circuit board by a press-fit technology. It should be noted that the present invention should not be limited thereto. For instance, the number of the terminal portions 61 can be varied based on requirements. Furthermore, another technology such as Surface Mounting Technology or Through-Hole Technology, can be used to connect mechanically and electrically the terminal portions 61 to the circuit board.

Because of difference in width, a step is formed between the first wall 62 and the major side wall 60. Each of the first walls 62 has an opening 63 therein which is preferably formed by punching. A cantilevered beam 64 extends outwardly from an edge of the opening 63 which edge is adjacent to the major side wall 60. The cantilevered beam 64 has a contact portion 65 which is formed by a bent portion adjacent to the distal end of the cantilevered beam 64. After the plug contacts 6 are retained in the plug housing 4, the first walls 62 are disposed within the slot 41.

The pair of the first walls 62 are positioned opposite and apart from each other. Each pair of the first walls 62 are bridged at front ends thereof and a first connecting bridge 66 is thereby formed which forms a first contact protection mechanism. The first connecting bridge 66 always connects the first walls 62 when the first walls 62 or the cantilevered beams 64 are in relaxed position or when they are pressed. This is advantageous to prevent improper deformation of the first walls 62 from occurring when the plug connector 2 is connected to the receptacle connector 1. Meanwhile, this may also significantly reduce the possibility of foreign particles entering into the plug and receptacle contacts 5, 6. In this embodiment, the first connecting bridge 66 and the first walls 62 are formed as one part, which is good for manufacturing and also advantageous to obtain a plug contact that is simple in structure but reliable in performance.

According to this embodiment, the first connecting bridge 66 is disposed in a middle portion of the front ends of the first walls 62, and is distanced from side edges 67 of the first wall 62. The first connecting bridge 66 has a width which is preferably not smaller than a half of the width of the first wall 62. The first wall 62 has a curved portion connecting the side edge 67 with the front end at each front corner of the first walls 62, which is particularly advantageous for mating of the receptacle contacts 5 and the plug contacts 6.

Figure 3:
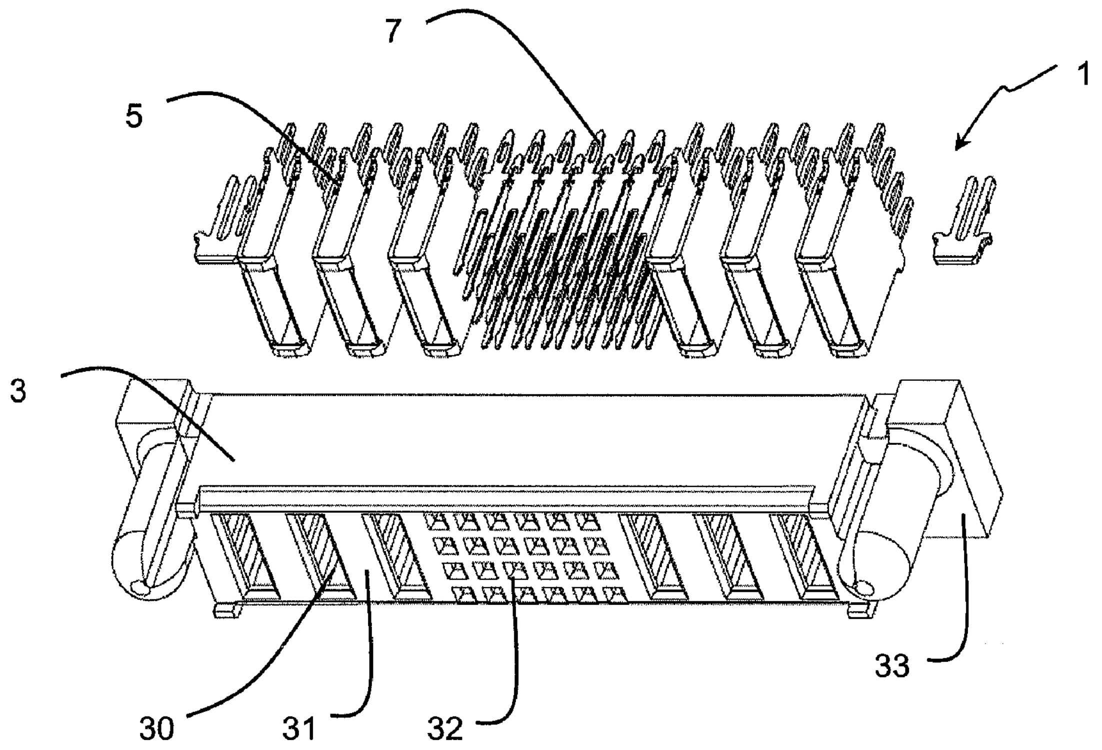
FIG. 3 is an exploded perspective view of a receptacle connector according to an embodiment of the present invention.

FIG. 3 shows an exploded perspective view of a receptacle connector 1 according to an embodiment of the present invention. Similar to the plug connector 2, the receptacle connector 1 comprises a receptacle housing 3, a plurality of receptacle contacts 5 retained in the receptacle housing 3 for transmuting power, and a plurality of receptacle signal contacts 7.

The receptacle housing 3 has a plurality of receiving passages 32 for receiving the corresponding receptacle signal contacts 7. The receiving passages 32 are distributed in a form of a matrix. The receiving passages 32 each passes through the receptacle housing 3 in a front-rear direction. The matrix of receptacle signal contacts 7 is disposed in a middle section of the receptacle housing 3, and beside the matrix, a plurality of channels 30 are disposed and extend from the front surface to the rear surface of the receptacle housing 3 to receive the corresponding receptacle contacts 5. The channels 30 each has a shape of flat and hollow cube, and are partitioned from one another by partition walls 31. The receptacle housing 3 further comprises a mating surface 33 positioned between the front and rear surfaces of the receptacle housing 3 and is substantially parallel to the front and rear surfaces of the receptacle housing 3. The distance between the mating surface 33 and the front surface of the receptacle housing 3 is substantially the same to the depth of the slot 41 in a depth/front-rear direction. After the plug connector 2 is mated with the receptacle connector 1, the front surface 42 of the plug connector 2 is in surface contact with the mating surface 33 of the receptacle connector 1.

Figure 4:
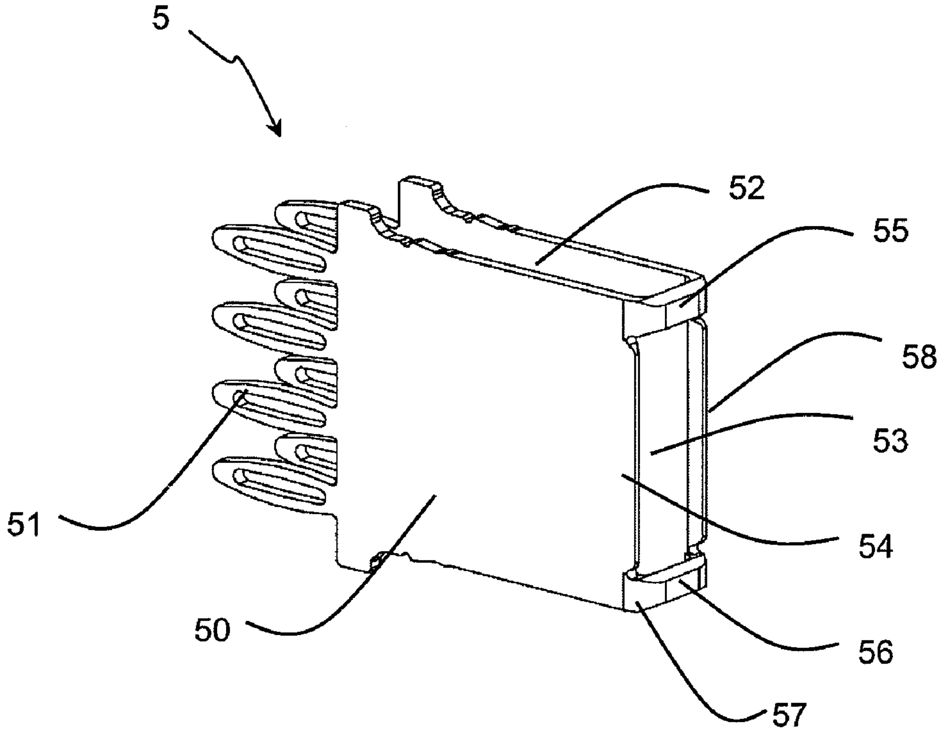
FIG. 4 is a perspective view of a receptacle contact according to an embodiment of the present invention.

FIG. 4 shows a perspective view of a receptacle contact 5 according to an embodiment of the present invention. Referring to FIGS. 3 and 4, similar to the plug contacts 6, the receptacle contacts 5 have same structure, therefore only one of them will be illustrated in details.

The receptacle contact 5 comprises a pair of second walls 50 which are opposite and parallel to each other, and a plurality of terminal pins 51 extending from an end of the corresponding second wall 50. In this embodiment, each of the second walls 50 has four terminal pins 51 and the terminal pins 51 extend rearwardly. The terminal pins 51 are connected to a corresponding circuit board by Press-Fit Technology. It should be noted that the present invention should not be limited thereto. The number of the terminal pins 51 can be varied based on requirements. Furthermore, the terminal pins 51 can be mechanically and electrically connected to the circuit board by using another technology such as Surface Mounting Technology or Through-Hole Technology.

The second walls 50 are spaced apart from each other, and thereby a mating space 52 is formed between the second walls 50 to receive the plug contact 6. The receptacle contact 5 further comprises an insertion opening 53 formed at the front end of the second walls 50. The insertion opening 53 which is in fluid communication with the mating space 52, allows insertion of the plug contact 6. The second walls 50 each has a front edge 54 forming a part of the border of the insertion opening 53. A pair of second connecting bridges 55 which bridging the front ends of the second walls 50 form the remaining part of the border of the insertion opening 53. The second connecting bridges 55 are positioned at opposite ends of the front edge of the second walls 50, respectively. Therefore, the insertion opening 53 has a width that is smaller than that of the second walls 50.

Each of the second connecting bridges 55 comprises a main body 56 which is substantially perpendicular to the second wall 50, and two connection portions 57 connecting the corresponding ends of the main body 56 with the front edge 54 of corresponding second walls 50, respectively. The connection portions 57 extend forwardly from the front edge 54 of one of the second walls 50 and are bent towards the other of the second walls 50. The second connecting bridges 55 accordingly protrude beyond the front edges 54.

With the second connecting bridges 55, the plug contact 6 can be guided into the receptacle contact 5, meanwhile, foreign particles entering into the contacts 5, 6 can be decreased. In this embodiment, the second walls 50 are provided with a guiding slant 58 along the insertion opening 53, which is particularly advantageous for engagement of the plug contacts 6 and the receptacle contact 5.

In this embodiment, the second connecting bridges 55 are formed as an integrated part of the second walls 50. Preferably, the receptacle contacts 5 have one-piece structure.

Figure 5:
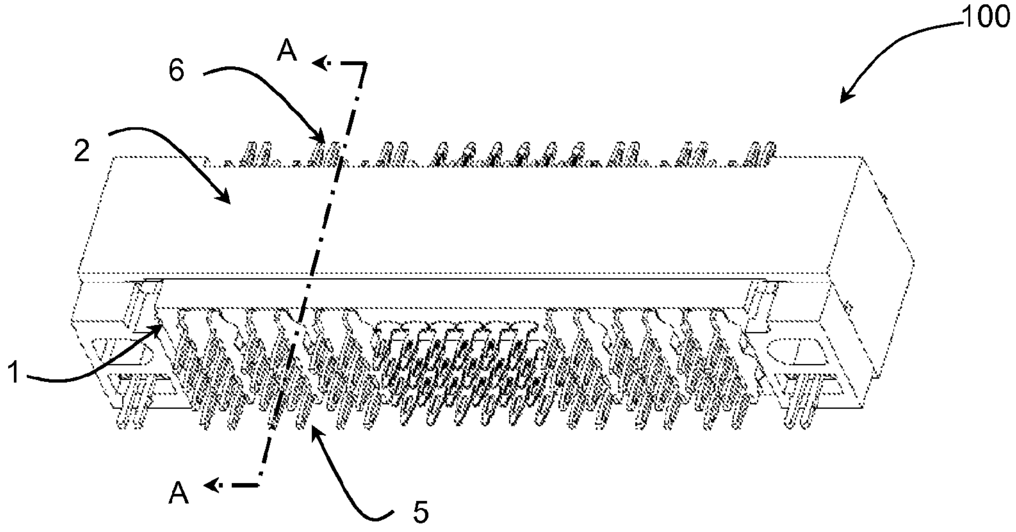
FIG. 5 is a perspective view of a power connector assembly according to an embodiment of the present invention, with a receptacle contact and a plug contact being mated.
Figure 6:
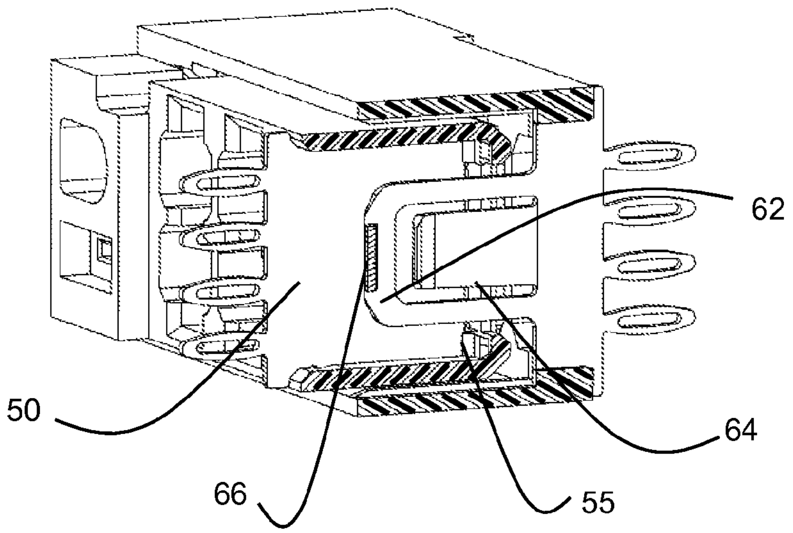
FIG. 6 is a side cross-sectional view taken along Line A-A in FIG. 5.
Figure 7:
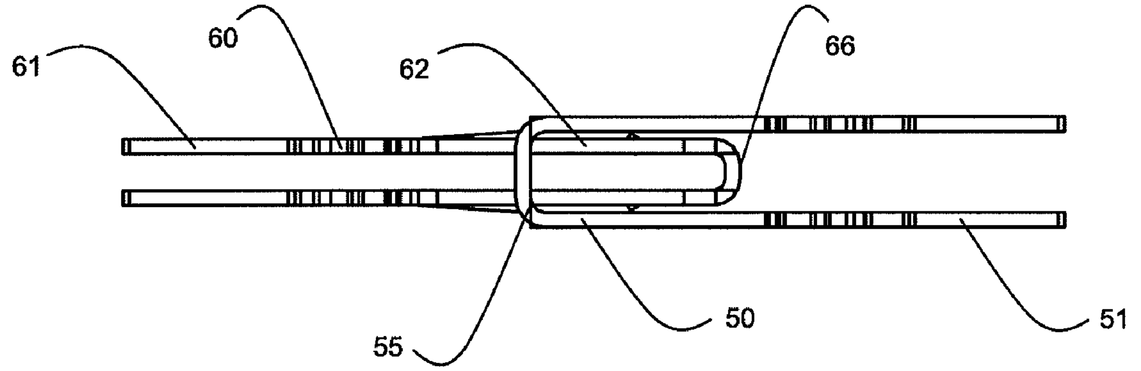
FIG. 7 is a side view with a plug contact and a receptacle being mated according to an embodiment of the present invention.
Figure 8:
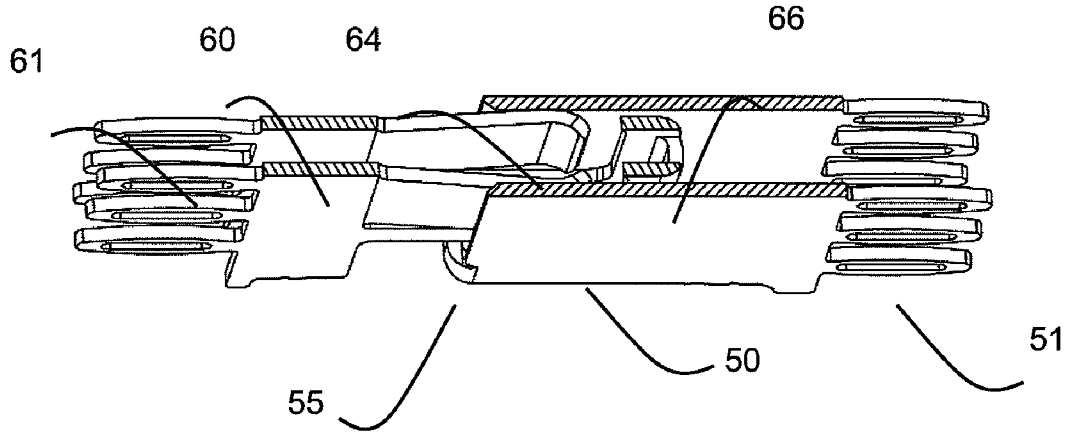
FIG. 8 is a side cross-sectional view of a plug contact mating with a receptacle contact.

FIG. 5 shows a perspective view of a power connector assembly 100 according to an embodiment of the present invention, wherein the receptacle connector 1 is connected to the plug connector 2. FIG. 6 shows a cross-sectional view taken along the Line A-A in FIG. 5. As shown in FIGS. 5 and 6, the receptacle connector 1 has the part located before the mating surface 33 received in the slot 41 of the plug connector 2, and the plug contacts 6 are mated with corresponding receptacle contacts 5. In particular, as shown in FIGS. 6 to 8, each pair of the first walls 62 of the plug contacts 6 are received in a corresponding mating space 52 via the corresponding insertion openings 53.

During engagement of the plug contacts 6 and the receptacle contacts 5, the first and second connecting bridges 66, 55 as well as the guiding slant 58 are helpful for the plug contacts 6 to mate with the corresponding receptacle contacts 5. When the plug contacts 6 are received in the corresponding mating space 52, the contact portion 65 of each of the cantilevered beams 64 is pressed by the corresponding second wall 50 and thereby it contacts with the inner surface of the second wall 50 reliably. The first connecting bridges 66 and the second connecting bridges 55 can reduce foreign particles that enter into the contacts and that might damage the contacts. Accordingly a power connector assembly with long life and high reliability can be expected.

While the description as set forth is only a preferred embodiment of the present invention, it can also achieve by other various embodiments.

For example, the first connecting bridges 66 and the second connecting bridges 55 are formed as an integral part of the plug contacts 6 and the receptacle contacts 5, respectively, according to the embodiments as set forth above. However, in alternative embodiments, the connecting bridges 66, 55 or at least one of them can be provided as a separated part from the contacts 6, 5 and then assembled to the contacts 6.

Furthermore, though the second connecting bridges 55 are provided along both ends of the insertion opening 53, in alternative embodiments, the second connecting bridges 55 can be formed along only one end of the insertion opening 53.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power connector comprising:

a housing; and a plurality of contacts received in the housing, at least one of the contacts comprising:

a pair of opposite walls spaced apart at a predetermined distance, the walls having a front end respectively, and a contact protection mechanism for protecting the contacts, wherein the contact protection mechanism bridges the front ends of the walls; and wherein the contact is a receptacle contact which comprises an insertion opening formed between the front ends of the walls and an engaging space disposed between the pair of walls for receiving a plug contact, the engaging space being in fluid communication with the insertion opening.

2. The power connector according to claim 1, wherein the contact protection mechanism is an integral part of at least one of the pair of the walls.

3. The power connector according to claim 1, wherein the contact protection mechanism is an integral part of the pair of the walls.

4. The power connector according to claim 1, wherein the contact protection mechanism comprises a connecting bridge connecting the front ends of the walls, and the connecting bridge protrudes beyond the front ends.

5. The power connector according to claim 1, wherein the contact protection mechanism extends along at least one edge of the insertion opening.

6. A power connector assembly comprising:

a plug connector comprising a first housing and a plurality of plug contacts received in the first housing, the plug contacts comprising a pair of first walls spaced apart from each other, respectively; and a receptacle connector for mating with the plug connector, the receptacle connector comprising a second housing and a plurality of receptacle contacts received in the second housing, the receptacle contacts comprising a pair of second walls spaced from each other and an insertion opening disposed between front ends of the walls for insertion of the corresponding plug contacts, respectively;

wherein the pair of first walls are bridged at the front tips thereof to formed a first connecting bridge, and/or the second walls are bridged at the front ends thereof to formed a second connecting bridge.

7. The power connector assembly according to claim 6, wherein each of the second connecting bridges extends along at an edge of the insertion opening.

8. The power connector assembly according to claim 6, wherein each of the second connecting bridges protrudes beyond the front ends of the second walls.

9. The power connector assembly according to claim 6, wherein the front ends of each pair of the second walls are bridged by the connecting bridges at opposite ends.

10. The power connector assembly according to claim 6, wherein each of the first walls comprises a side edge extending along an insertion direction along which the corresponding plug contact is inserted, and the first connecting bridge is distanced from the side edge in a direction perpendicular to the insertion direction.

11. The power connector assembly according to claim 10, wherein the front end of each of the first walls comprise a middle portion, and the first connecting bridge is disposed at the middle portion.

12. The power connector assembly according to claim 10, wherein at least one of the first connecting bridges has a width which is at least a half of that of the first wall.

13. The power connector assembly according to claim 10, wherein each of the first walls has an opening and a cantilever beam for contacting with the corresponding receptacle contact, the cantilever beams extending outwardly from an edge of the opening.

14. The power connector assembly according to claim 6, wherein at least one of the first connecting bridges is integrated with the corresponding pair of the first walls, and at least one of the second connecting bridges is integrated with the corresponding pair of second walls.

15. A plug contact for a power connector, the plug contact comprising:

a pair of opposite walls spaced apart at a predetermined distance, each wall comprising an opening and a cantilever beam extending outwardly from an edge of the opening for contacting with a receptacle contact; and at least one connecting bridge connecting front ends of the walls.

16. The plug contact according to claim 15, wherein each of the walls comprises a side edge extending in frontward and rearward directions, and wherein the contact protection mechanism is distanced from at least one of the side edges.

17. The plug contact according to claim 15, wherein each front end has a middle portion, and the contact protection mechanism is formed on the middle portion.

18. The plug contact according to claim 15, wherein the contact protection mechanism has a width which is at least a half of a width of the front ends of the walls.

19. The plug contact according to claim 15, wherein the openings are located behind the front ends and the cantilever beams are deformable in the corresponding openings.

* * * * *